United States Patent [19]

Wiren

[11] Patent Number: 4,975,594
[45] Date of Patent: Dec. 4, 1990

[54] FREQUENCY DETECTOR CIRCUIT

[75] Inventor: Leland G. Wiren, Phoenix, Ariz.

[73] Assignee: AG Communication Systems Corporation, Phoenix, Ariz.

[21] Appl. No.: 316,750

[22] Filed: Feb. 28, 1989

[51] Int. Cl.⁵ .......................... H03L 7/00; H03K 9/06
[52] U.S. Cl. ..................................... 307/271; 307/522; 307/525; 307/269; 328/109; 328/120
[58] Field of Search ............... 328/133, 155, 109, 120; 307/271, 269, 480, 272.1, 510, 517, 518, 522, 525

[56] References Cited

U.S. PATENT DOCUMENTS 3,350,580 10/1967 Harrison ............................. 328/120
4,144,448 3/1979 Pisciotta et al. .................... 328/120
4,427,948 1/1984 Rinaldi ............................... 328/120

FOREIGN PATENT DOCUMENTS 0112150 9/1979 Japan .
0279612 11/1988 Japan .

OTHER PUBLICATIONS

"Variable Frequency Missing Pulse Detector", by Admas, IBM Technical Disclosure Bulletin, vol. 6, No. 7, Dec. 1963.

Primary Examiner—Stanley D. Miller
Assistant Examiner—Richard Roseen
Attorney, Agent, or Firm—Anthony J. Baca

[57] ABSTRACT

A circuit for determining the validity of the frequency of a clock signal is shown. The circuit includes a frequency detector circuit having a synchronizer which receives the clock signal and synchronizes it to a synchronous clock signal. A pattern detector detects an error pattern from the synchronizer and generates an error signal which is transmitted to a latch and stored.

5 Claims, 2 Drawing Sheets

FREQUENCY DETECTOR CIRCUIT

FIELD OF THE INVENTION

The present invention relates in general to digital clock generating systems, and more particularly, to a circuit for determining the validity of the frequency of a clock signal.

BACKGROUND OF THE INVENTION

In modern digital telecommunication switching systems voice samples are transferred within switching systems, as well as, between remotely located switching systems, as digital information. To preserve the integrity of the digital information and thus insure high quality voice communications, the telecommunication network is synchronized.

Therefore, it is a requirement for a telephone switching system to synchronize its local clock (slave) to that of the network (reference). Synchronization of the slave clock must be very precise and accurate since other remotely located switching systems may be synchronized to this switching system.

Synchronization between two clock signals is best accomplished by the use of a Phase Locked Loop (PLL) circuit. However, PLL circuits have several disadvantages.

As the reference signal changes frequency the PLL circuit follows these changes within certain limits. Problems arise when the reference signal drifts outside of these limits, or is completely lost, such as when a cable is cut. PLL Because the amount that the PLL circuit frequency will have drifted is proportional to the time it takes to declare the reference frequency erroneous, a fast, accurate method of frequency detection is necessary. Prior to the present invention, frequency detection was primarily accomplished by the use of mono-stable vibrators.

The mono-stable vibrator would be designed to have a period greater than the period of the signal to be monitored, and the signal would constantly retrigger the mono-stable vibrator before it would time-out. This type of frequency detector can only detect if the frequency is too low; a high frequency would continue to retrigger the mono-stable vibrator within the time-out period and an alarm condition would not be detected.

Additionally, mono-stable vibrators tend to drift as a function of age and temperature which must be considered during their design. If accurate timing is needed, the discrete resistors used by the mono-stable vibrator are laser trimmed to provide an exact resistance, and thus an accurate time-out period, a very expensive process.

Accordingly, it is the objective of the present invention to provide a frequency detector circuit which rapidly detects an error condition when the frequency of the signal being monitored is beyond a predetermined limit.

SUMMARY OF THE INVENTION

In accomplishing the objective of the present invention, there is provided a novel circuit for determining the validity of the frequency of a reference clock signal.

This circuitry for determining the validity of the frequency of a reference clock signal includes a synchronizer which receives the reference clock signal and synchronizes it to a synchronous clock signal.

This circuitry also includes a pattern detector which detects an error pattern from the synchronizer and generates an error signal when the error pattern is detected.

Finally, a latch is connected to the pattern detector which latches the error signal.

DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
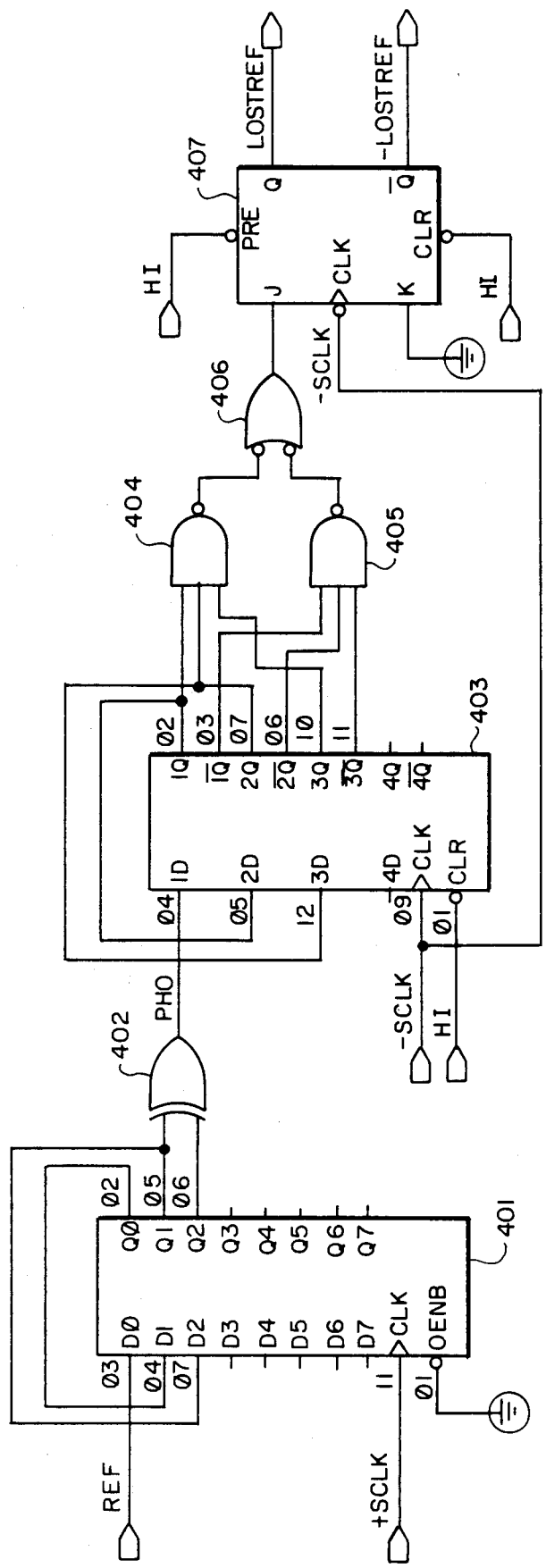
FIG. 1 is a schematic diagram of the frequency detector circuit shown in FIG. 1.

Turning to FIG. 1, a general description of the present invention will now be given.

The Frequency detector circuit compares the signal to be monitored (the reference signal REF) with a second signal, (SCLK) looking for a predetermined bit pattern. If this pattern is found, then the input signal has drifted beyond acceptable limits and an alarm is signaled. The second signal must be an integer multiple of the signal to be monitored, and in the present invention it has a frequency of four times the monitored signal. The frequency detector circuit of the present invention allows an erroneous signal to be detected in a maximum of four and one-half ($\frac{1}{2}$) clock cycles of the second signal after the fault.

Looking at FIG. 1 in more detail, the signal to be monitored REF is first delayed through three D-FFs in 401. Device 401 has a total of eight D-FFs in one package all having a common clock signal and output enable signal. However, for the present invention only three D-FFs with a common clock signal are required. The outputs of the second and third D-FFs in 401 are connected to an EXCLUSIVE-OR gate 402. Under normal conditions, the output of 402 (PHO) will be a clock signal with a frequency of two times (2×) that of the reference. The output of 402 is again delayed by three D-FFs in 403. Device 403 has a total of four D-FFs in one package all having a common clock signal and clear signal also both output polarities of each D-FF are provided. However, for the present invention only three D-FFs with a common clock signal and both output polarities of each D-FF are required.

NAND gates 404, 405 and 406 are arranged to detect three consecutive logic highs or logic lows in the clock stream of 402. If detected, an alarm signal is latched by JK-FF 407. It must be understood that in the present invention, SCLK has a frequency of four times (4×) that of REF.

With renewed reference to FIG. 1, and with the aid of FIGS. 2a, 2b, 2c, and 2d, a detailed description of the operation of the frequency detector will be given.

The frequency detector circuit compares the signal to be monitored (REF) with a second clock signal (SCLK). The second clock signal counts the state transitions of the REF signal, effectively monitoring the period of REF. If the period of REF increases or decreases by more than thirty three percent (%33), then the REF signal has drifted beyond acceptable limits and an alarm is signaled.

The signal to be monitored REF is first clocked by the rising edge of SCLK into a series of three D-FFs in 401 of which the second and third outputs are connected to the EXCLUSIVE-OR gate 402. It will be appreciated by those skilled in the art that, the first and second D-FFs of 401 form double buffer, whereby any set-up or hold time violations are not propagated through the frequency detector. This removes any requirement on phase relations between REF and SCLK. However, there still remains a frequency relationship required by the present invention. The relationship chosen by the present invention is that the SCLK's frequency is four times (4×) that of REF.

Figure 2A:
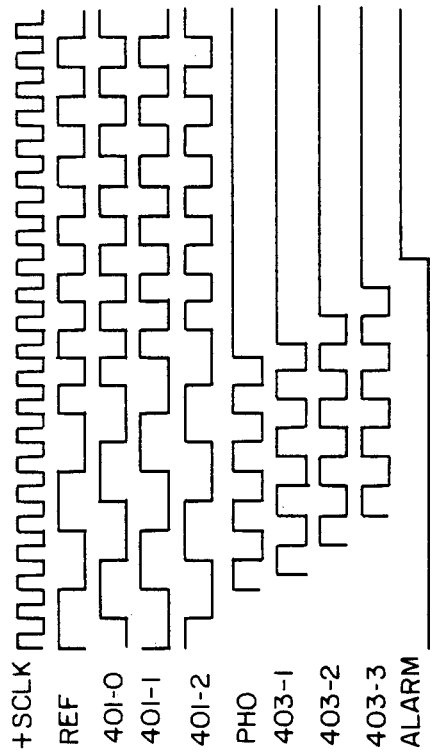
FIG. 2a is a timing diagram for the circuit of FIG. 1, showing the state of selected signals for normal operation.

As is shown in FIG. 2a, under normal conditions, the output of EXCLUSIVE-OR gate 402 (PHO) is a clock signal with a frequency of two times (2×) that of the REF. The output of EXCLUSIVE-OR gate 402 (PHO) is clocked by the falling edge of SCLK into another series of three D-FFs in 403. If the falling edge of SCLK clocks in three consecutive logic lows, NAND gate 405 will output a logic low. If the falling edge of SCLK clocks in three consecutive logic highs, NAND gate 404 will output a logic low. Should either NAND gate 404 or NAND gate 405 output a logic low signal, NAND gate 406 will output a logic high signal and the next falling edge of SCLK will clock an alarm signal out of JK-FF 407.

Figure 2C:
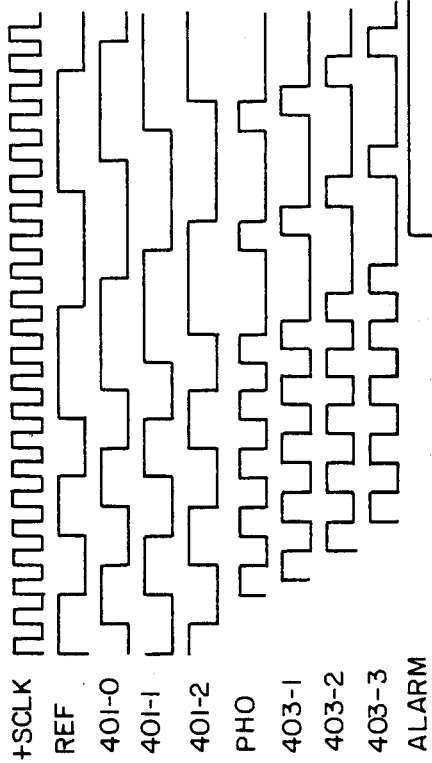
FIG. 2c is a timing diagram for the circuit of FIG. 1, showing the state of selected signals when the reference frequency is doubled.
Figure 2B:
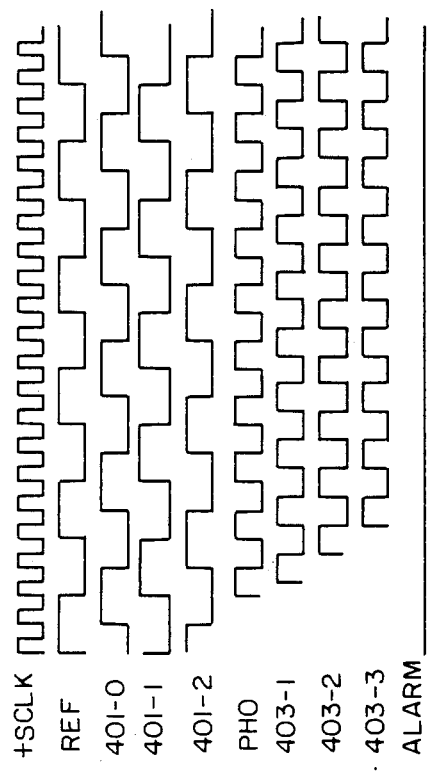
FIG. 2b is a timing diagram for the circuit of FIG. 1, showing the state of selected signals when the reference frequency is completely lost.

In FIG. 2b, REF is completely removed and the resultant signals are traced. When the falling edge of SCLK clocks in three consecutive logic lows into the three D-FF of 403, NAND gates 405 and 406 detect an alarm condition which is latched by JK-FF 407. FIG. 2b shows that it takes four and one-half (½) cycles of SCLK to detect the fault.

In FIG. 2c REF is suddenly doubled in frequency. In this case, the falling edge of SCLK clocks in three consecutive logic highs into the three D-FF of 403, NAND gates 404 and 406 detect an alarm condition which is latched by JK-FF 407. FIG. 2c shows that it takes four and one-half (½) cycles of SCLK to detect the fault.

Figure 2D:
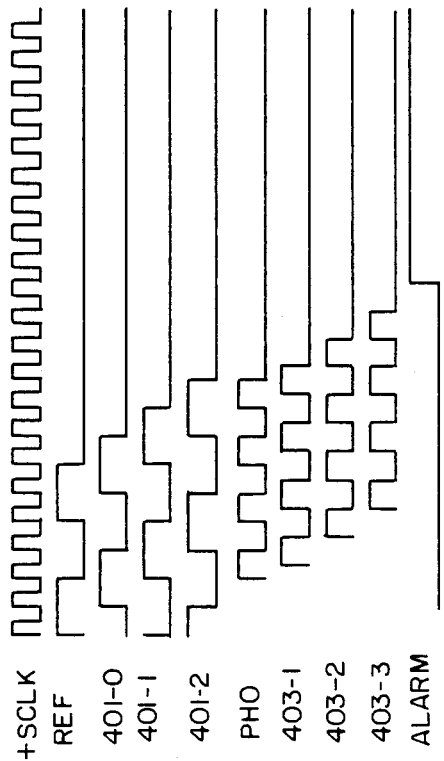
FIG. 2d is a timing diagram for the circuit of FIG. 1, showing the state of selected signals when the reference frequency is cut by one-half.

In FIG. 2d REF is suddenly halved in frequency. In this case, the falling edge of SCLK clocks in three consecutive logic lows into the three D-FF of 403, NAND gates 405 and 406 detect an alarm condition which is latched by JK-FF 407. FIG. 2d shows that it takes four and one-half (½) cycles of SCLK to detect the fault.

Although the preferred embodiment of the invention has been illustrated, and that form described, it will be readily apparent to those skilled in the art that various modifications may be made therein without departing from the spirit of the invention or from scope of the appended claims.

What is claimed is:

1. A frequency detector circuit for determining the validity of the frequency of a reference clock signal, said frequency detector circuit comprising:
   a first set of FFs arranged to receive said reference clock signal and synchronize said reference clock signal to a synchronous clock signal;
   a second set of FFs arranged to detect an error pattern from said first set of FFS, said error pattern is present when said reference clock signal's frequency is greater than a preset level, alternatively, said error pattern is present when said reference clock signal's frequency is less than a preset level, said second set of FFs generates an error signal when said error pattern is detected, and said second set of FFs further arranged to receive said synchronous clock signal, and;
   a single FF arranged to latch said error signal from said second set of FFs.

2. A frequency detector circuit for determining the validity of the frequency of a reference clock signal, said frequency detector circuit comprising:
   synchronizer means for synchronizing said reference clock signal to a synchronous clock signal, said shynchronizer means includes a first pluality of Flip-Flops (FFs) connected as a shift-register all having a common clock input arranged to receive said synchronous clock signal, said reference clock signal is clocked into said shift-register by said synchronous clock signal;
   pattern detector means arranged to detect an error pattern from said synchronizer means, said error pattern is present when said reference clock signal's frequency is greater than a preset level, alternatively, said error pattern is present when said reference clock signal's frequency is less than a preset level, said pattern detector means generates an error signal when said error pattern is detected, said pattern detector means includes a second pluality of Flip-Flops (FFs) connected as a shift-register all having a common clock input arranged to receive said synchronous clock signal, and;
   latch means arranged to latch said error signal.

3. A frequency detector circuit as claimed in claim 2, wherein said latch means comprises a Flip-Flop.

4. A frequency detector circuit as claimed in claim 2, wherein each of said second plurality of FFs provides a positive output and a negative output 5. A frequency detector circuit as claimed in claim 4, wherein said pattern detector means further includes a first NAND gate arranged to receive said positive outputs from each of said second pluality of FFs, a second NAND gate arranged to receive said negative outputs from each of said second pluality of FFs, and said pattern detector means further including a third NAND gate arranged to receive signals from said first and said second NAND gates, said third NAND gate generates said error signal.

* * * * *